US012757476B2

(12) United States Patent
Yoo et al.

(10) Patent No.: US 12,757,476 B2
(45) Date of Patent: Oct. 6, 2026

(54) THYRISTOR BASED ON CHARGE PLASMA AND CROSS-POINT MEMORY ARRAY INCLUDING THE SAME

(71) Applicant: IUCF-HYU (INDUSTRY-UNIVERSITY COOPERATION FOUNDATION HANYANG UNIVERSITY), Seoul (KR)

(72) Inventors: Sang Dong Yoo, Seoul (KR); Jea Gun Park, Seoul (KR); Tae Hun Shim, Seoul (KR); Min Won Kim, Seoul (KR); Byoung Seok Lee, Seoul (KR); Ji Hun Kim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 357 days.

(21) Appl. No.: 18/578,745

(22) PCT Filed: Jul. 12, 2022

(86) PCT No.: PCT/KR2022/010145
§ 371 (c)(1),
(2) Date: Jan. 12, 2024

(87) PCT Pub. No.: WO2023/287173
PCT Pub. Date: Jan. 19, 2023

(65) Prior Publication Data

US 2024/0322023 A1 Sep. 26, 2024

(30) Foreign Application Priority Data

Jul. 12, 2021 (KR) ........................ 10-2021-0091178

(51) Int. Cl.
*H10D 84/00* (2025.01)
*H10B 12/10* (2023.01)
(Continued)

(52) U.S. Cl.
CPC ........... *H10D 84/133* (2025.01); *H10B 12/10* (2023.02); *H10D 62/126* (2025.01); *H10D 62/142* (2025.01); *H10D 62/148* (2025.01)

(58) Field of Classification Search
CPC ........ H10B 12/00; H10D 18/00; H10D 62/10; H10D 62/122; H10D 84/00; H10D 84/60
See application file for complete search history.

(56) References Cited

U.S. PATENT DOCUMENTS

| | | | | |
|---|---|---|---|---|
| 7,381,999 B1 * | 6/2008 | Yang | ...................... | H10B 99/20 257/407 |
| 2009/0290412 A1 * | 11/2009 | Mouli | ................. | G11C 11/5678 438/129 |

(Continued)

FOREIGN PATENT DOCUMENTS

| | | |
|---|---|---|
| KR | 101399195 B1 | 5/2014 |
| KR | 1020180062699 A | 6/2018 |

(Continued)

OTHER PUBLICATIONS

B. Rajasekharan, R.J.E. Hueting et al., "Charge Plasma Diode-A Novel Device Concept" in Proc. ULIS, Jan. 2008, p. 576-579.

(Continued)

*Primary Examiner* — Fazli Erdem
(74) *Attorney, Agent, or Firm* — NKL Law; Jae Youn Kim

(57) ABSTRACT

The present invention relates to a thyristor having a vertical structure and a cross-point memory array including the same. The thyristor having a vertical structure according to one embodiment may include a semiconductor core with an
(Continued)

insulating film formed on the outer peripheral surface thereof, and a plurality of metal layers formed on the insulating film. In the semiconductor core, at least one layer of a base layer and an emitter layer may be formed on a region corresponding to each of the metal layers based on the charge plasma phenomenon due to the difference in work function with the metal layers.

8 Claims, 13 Drawing Sheets

(51) Int. Cl.

| | |
|---|---|
| ***H10D 62/10*** | (2025.01) |
| ***H10D 62/13*** | (2025.01) |

(56) References Cited

U.S. PATENT DOCUMENTS

| | | | | |
|---|---|---|---|---|
| 2017/0229306 | A1 * | 8/2017 | Luan ...................... | H10B 12/10 |
| 2018/0130804 | A1 | 5/2018 | Luan et al. | |
| 2020/0135738 | A1 | 4/2020 | Luan et al. | |

FOREIGN PATENT DOCUMENTS

| | | | |
|---|---|---|---|
| KR | 102102062 | B1 | 4/2020 |
| KR | 102212421 | B1 | 2/2021 |

OTHER PUBLICATIONS

Sukeshni Tirkey et al., "Junction-less charge plasma TFET with dual drain work functionality for suppressing ambipolar nature and improving radio-frequency performance", Published in Micro & Nano Letters; Received on Mar. 25, 2017, pp. 18-23.

* cited by examiner

220

230

280

310

320

330

340

THYRISTOR BASED ON CHARGE PLASMA AND CROSS-POINT MEMORY ARRAY INCLUDING THE SAME

STATEMENT DESIGNATING GRACE PERIOD INVENTOR DISCLOSURES

Applicant informs that the thesis “Charge-Plasma-Based Doping-less Vertical Thyristor for Highly Integrated Volatile Memory-Cell” containing the subject matter of this application was disclosed by the inventor or joint inventor or by another who obtained the subject matter disclosed directly or indirectly from the inventor or joint inventor on Oct. 4, 2020 (which is one year or less before the effective filing date of a claimed invention) which does not quality as prior art under 35 U.S.C. 102(b) in the following website:

| |
|---|
| https://iopscience.iop.org/article/10.1149/MA2020-02141356mtgabs |

TECHNICAL FIELD

The present invention relates to a thyristor and a cross-point memory array including the same, and more particularly, to a technical idea of implementing thyristor operation without a doping process.

BACKGROUND ART

Typically, a dynamic random-access memory (DRAM) cell consists of one selection transistor (IT) and one cylindrical capacitor (IC). To meet the demand for high integration of memory, research is continuing to implement a degree of integration of 1 terra bit (Tb) or more.

Specifically, to fabricate a DRAM cell with a degree of integration of 1 terra bit, a transistor design rule must be 10 nm or less and the height of cylindrical capacitors must be approximately 2.0 μm or more. However, when the height of the cylindrical capacitors is 2.0 μm or more, problems such as bridge phenomenon between the cylindrical capacitors occur, which physically limits the high integration of DRAM.

To overcome the physical limitations of DRAM described above, research on perpendicular spin-torque-transfer magnetic random access memory (p-STT-MRAM) with a 1T+1R structure in which a capacitor is replaced with a magnetic tunnel junction (MTJ), SOI-based IT-DRAM with a IT structure that stores charges in the body of a silicon-on-insulator (SOI) substrate instead of a capacitor, and thyristor-based IT-DRAM is actively underway.

In particular, thyristor-based IT-DRAM has advantageous memory characteristics such as high read current (>few 100 μA/cell), non-destructive read conditions, and high on/off current ($I_{on/of}$) ratio (memory margin: >106).

Specifically, IT-DRAM based on a 3-terminal thyristor is also called a thin capacitively-coupled thyristor (TCCT). The concept of fast write operation of IT-DRAM is as follows. When a high voltage is applied to an anode, current flowing through a thyristor increases and the gate capacitance of a p-base region becomes much smaller than the sum of the junction capacitance of both n regions, resulting in a ‘1’ state where the potential of the p-base region increases. In addition, when a low voltage is applied to an anode, current flowing through a thyristor decreases, and the gate capacitance of a p-base region becomes much greater than the sum of the junction capacitance of both n regions, resulting in a ‘0’ state where the potential of the p-base region decreases. IT-DRAM operates as a memory using the ‘0’ and ‘1’ states.

However, the thyristor-based IT-DRAM is mainly implemented in a horizontal structure based on 3 terminals (anode, cathode, and gate terminal) and an SOI substrate in a p-n-p-n structure, showing limitations in scaling down.

To solve the scaling-down problem arising from the existing DRAM capacitor and the existing SOI-based horizontal 3-terminal thyristor, by controlling the latch-up and latch-down voltages by adjusting the thickness of the n-type base (n-base) area of a two-terminal vertical thyristor-based cross-point memory cell, previous research has been conducted to confirm the conditions for operating as a cross-point memory without a selector.

Specifically, in the previous study, it was confirmed that when the thickness of an n-type base is 180 nm or less, a latch-up voltage ($V_{LU}$)/2 exists in a dead region and may operate as a cross-point memory of a half-bias scheme without a selector.

However, in the two-terminal vertical thyristor-based cross-point memory implemented through the previous research, the high doping concentration of each layer causes changes in a dopant profile due to dopant diffusion during a high-temperature process, preventing a thyristor from operating normally. In addition, there is a high possibility that a misfit dislocation may form at a junction, causing leakage current.

In addition, the two-terminal vertical thyristor-based cross-point memory has a problem that the memory is difficult to apply to memory mass production due to low throughput due to an in-situ doping epitaxial growth process. When scaling down to the nanoscale, there is a limitation in that random dopant fluctuation (RDF) occurs and variation between memory cells cannot be avoided.

DISCLOSURE

Technical Problem

Therefore, the present invention has been made in view of the above problems, and it is one object of the present invention to provide a thyristor capable of being implemented through the charge plasma phenomenon without a doping process and securing excellent electrical characteristics in memory operation and a cross-point memory array including the thyristor.

It is another object of the present invention to provide a thyristor capable of being applied to a memory cell without a capacitor and a doping process and solving problems caused by dopant diffusion, misfit dislocation, RDF, low throughput, and low mobility and a cross-point memory array including the thyristor.

It is yet another object of the present invention to provide a thyristor suitable for mass production and a cross-point memory array including the thyristor.

Technical Solution

In accordance with one aspect of the present invention, provided is a thyristor having a vertical structure, the thyristor including a semiconductor core with an insulating film formed on an outer peripheral surface thereof; and a plurality of metal layers formed on the insulating film, wherein, in the semiconductor core, at least one layer of a base layer and an emitter layer is formed on a region corresponding to each of the metal layers based on a charge plasma phenomenon due to a difference in work function with the metal layers.

According to one aspect of the present invention, in the semiconductor core, a first emitter layer may be formed on a first region corresponding to a first metal layer among the metal layers, a first base layer may be formed on a second region corresponding to a second metal layer among the metal layers, a second base layer may be formed on a third region corresponding to a third metal layer among the metal layers, and a second emitter layer may be formed on a region corresponding to a fourth metal layer among the metal layers.

According to one aspect of the present invention, the semiconductor core, the first emitter layer may be formed as an n-type emitter layer, the first base layer may be formed as a p-type base layer, the second base layer may be formed as an n-type base layer, and the second emitter layer may be formed as a p-type emitter layer.

According to one aspect of the present invention, in the semiconductor core, the first emitter layer may be formed as a p-type emitter layer, the first base layer may be formed as an n-type base layer, the second base layer may be formed as a p-type base layer, and the second emitter layer may be formed as an n-type emitter layer.

According to one aspect of the present invention, in the semiconductor core, the first emitter layer, the first base layer, the second base layer, and the second emitter layer may be formed based on the first and fourth metal layers having different work functions.

According to one aspect of the present invention, in the semiconductor core, the first emitter layer and the second base layer may be formed based on the first and third metal layers having identical work functions, and the first base layer and the second emitter layer may be formed based on the second and fourth metal layers having identical work functions.

In accordance with another aspect of the present invention, provided is a thyristor-based cross-point memory array including a plurality of word lines arranged parallel to a first direction; a plurality of bit lines arranged parallel to a second direction intersecting the first direction; and a plurality of memory cells formed in regions where the word lines and the bit lines intersect, wherein each of the memory cells includes a thyristor in which at least one of a base layer and an emitter layer is formed based on a charge plasma phenomenon due to a difference in work function between a semiconductor core and a plurality of metal layers.

According to one aspect of the present invention, an insulating film may be formed on an outer peripheral surface of the semiconductor core, and the metal layers may be formed on the insulating film.

According to one aspect of the present invention, in the semiconductor core, a first emitter layer may be formed on a first region corresponding to a first metal layer among the metal layers, a first base layer may be formed on a second region corresponding to a second metal layer among the metal layers, a second base layer may be formed on a third region corresponding to a third metal layer among the metal layers, and a second emitter layer may be formed on a region corresponding to a fourth metal layer among the metal layers.

According to one aspect of the present invention, the memory cells may share the single second metal layer and the single third metal layer.

Advantageous Effects

According to one embodiment, the present invention can secure excellent electrical characteristics in memory operation by implementing a thyristor through the charge plasma phenomenon without a doping process.

According to one embodiment, the present invention can solve problems caused by dopant diffusion, misfit dislocation, RDF, low throughput, and low mobility by applying a thyristor to a memory cell without a capacitor and a doping process.

According to one embodiment, the present invention can provide a thyristor suitable for mass production.

BEST MODE

Figure 1A:
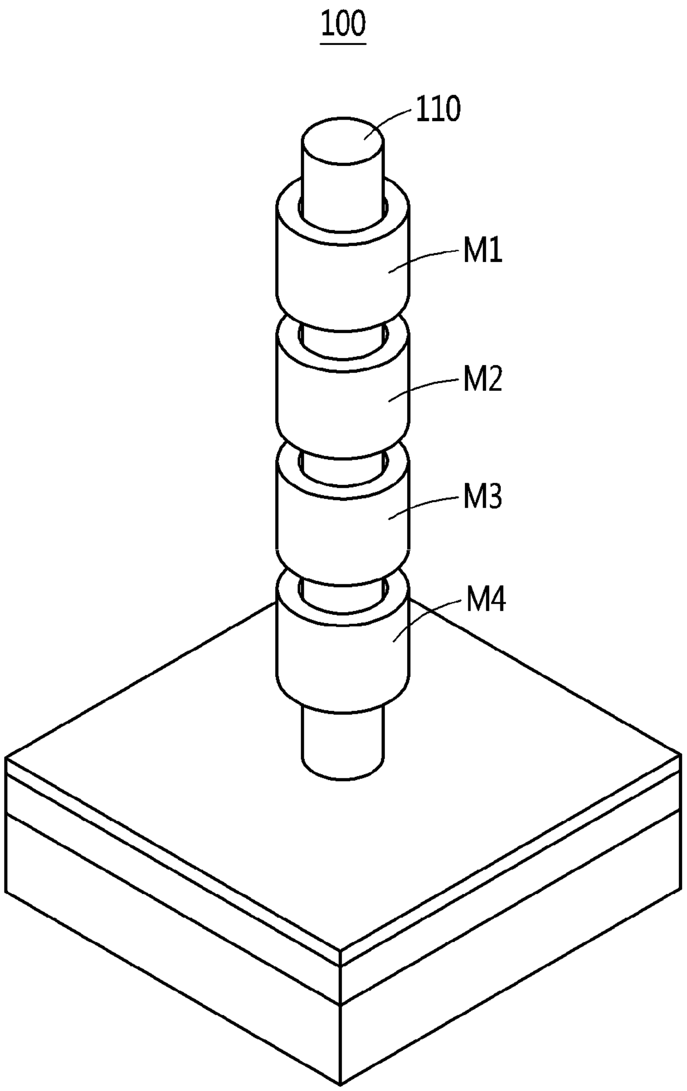
FIGS. 1A and 1B are diagrams for explaining a thyristor having a vertical structure according to one embodiment.

Hereinafter, the embodiments of the present invention will be described in detail with reference to the drawings.

However, it should be understood that the present invention is not limited to the embodiments according to the concept of the present invention, but includes changes, equivalents, or alternatives falling within the spirit and scope of the present invention.

In the following description of the present invention, detailed description of known functions and configurations incorporated herein will be omitted when it may make the subject matter of the present invention unclear.

In addition, the terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), the first element may be directly connected to the second element or may be connected to the second element via an intervening element (e.g., third).

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

In the above-described specific embodiments, elements included in the invention are expressed in singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present invention has been described with reference to exemplary embodiments, but it should be understood that various modifications may be made without departing from the scope of the present invention.

Therefore, the scope of the present invention should not be limited by the embodiments, but should be determined by the following claims and equivalents to the following claims.

Figure 1B:
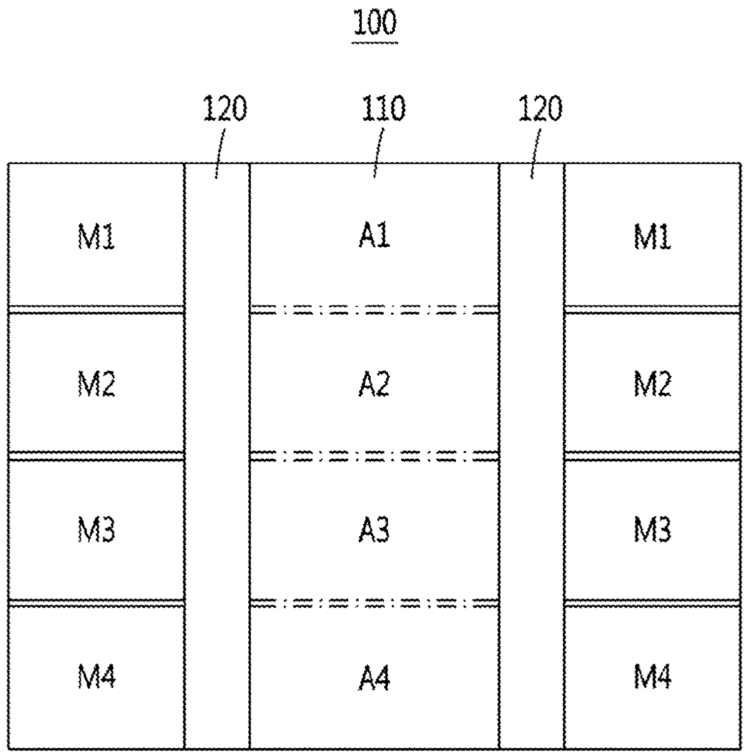
Figure 2A:
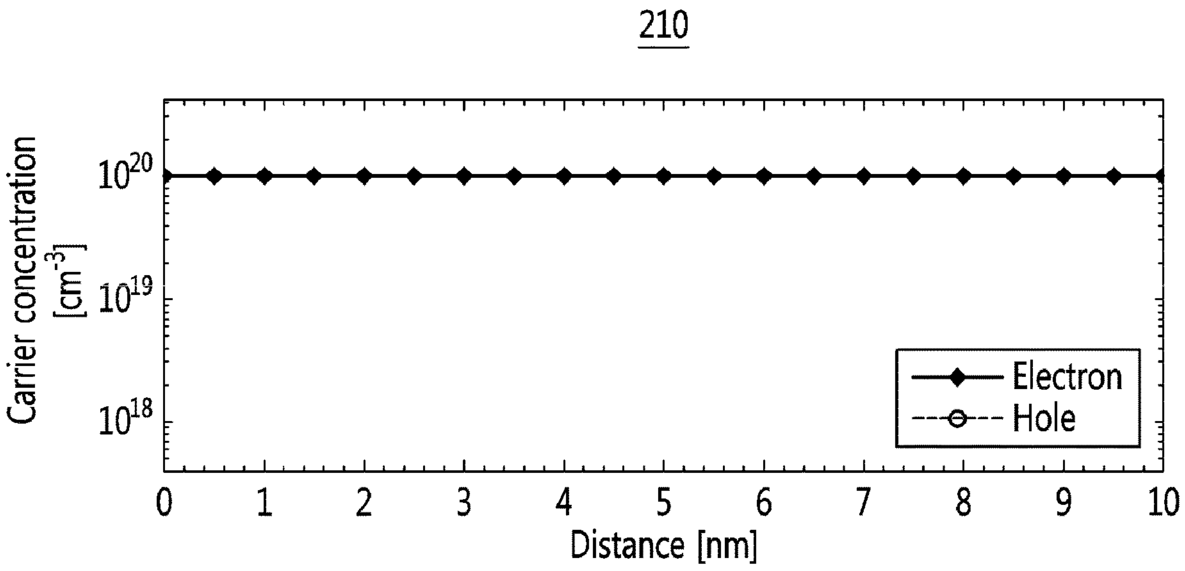
FIGS. 2A to 2H are diagrams for explaining carrier concentration characteristics depending on the cross-sectional width of a thyristor according to one embodiment.
Figure 2B:
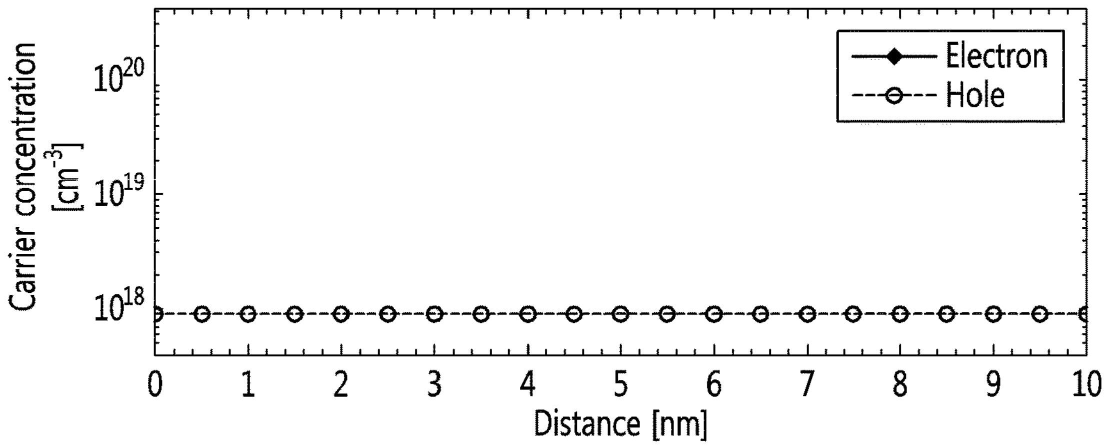
Figure 2C:
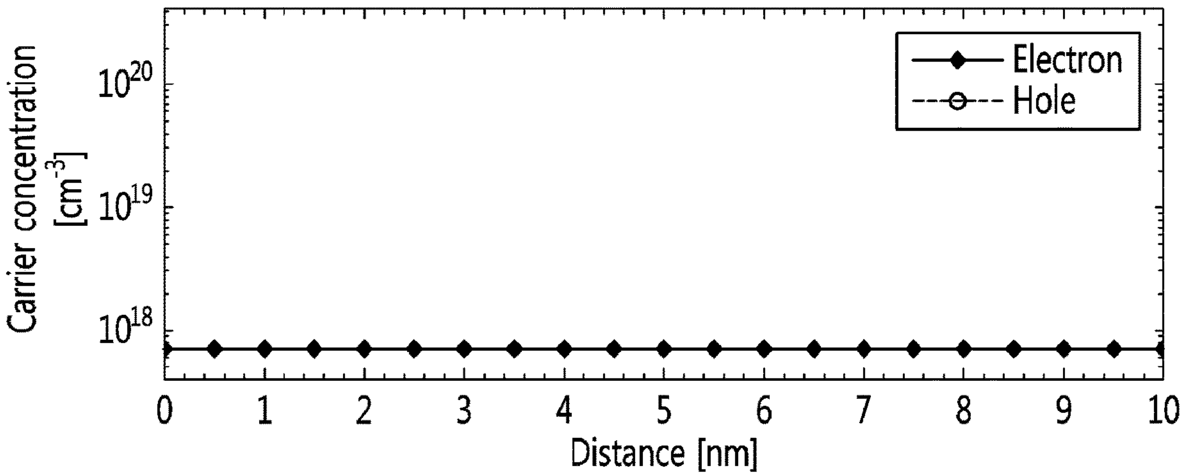
Figure 2D:
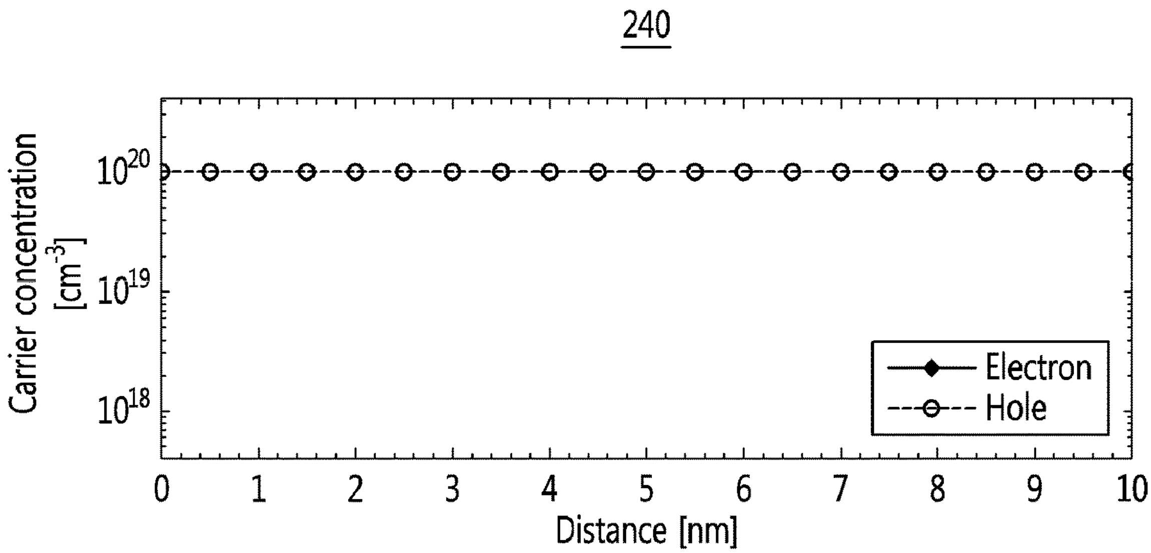
Figure 2E:
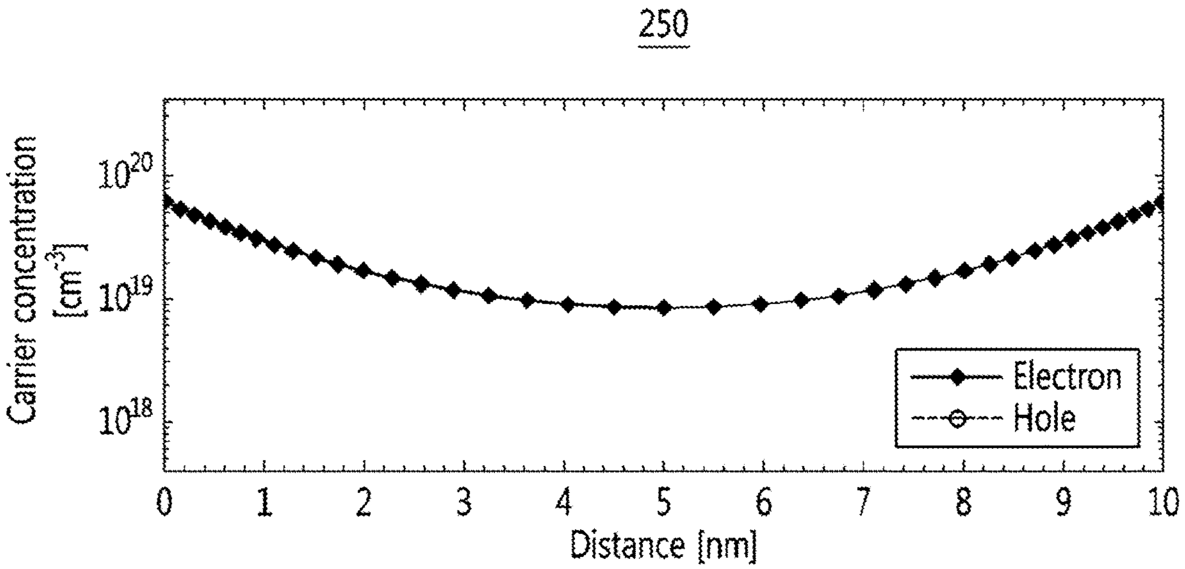
Figure 2F:
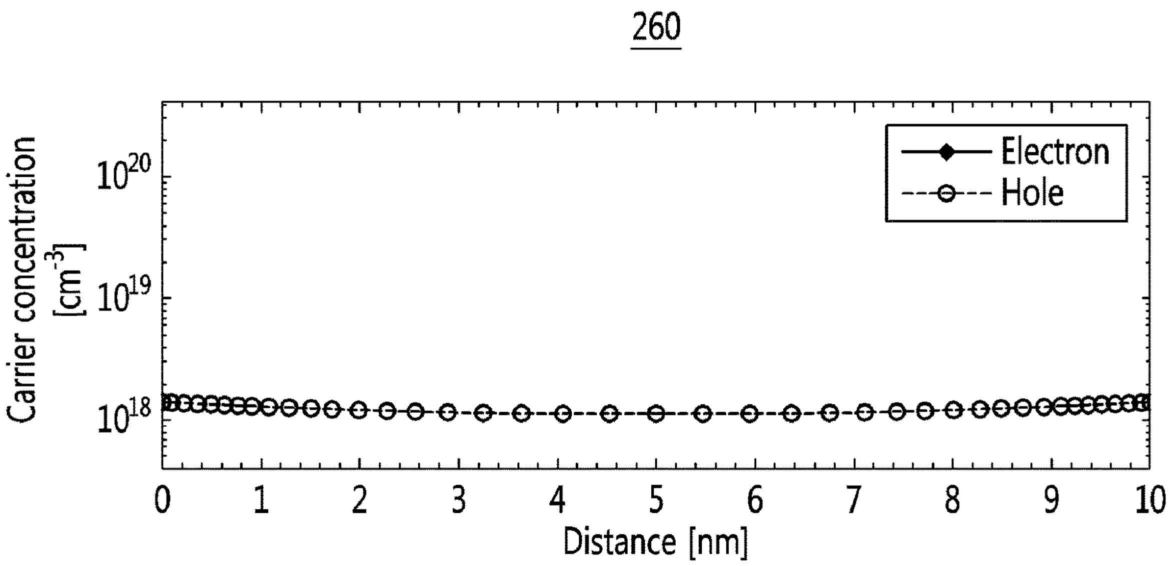
Figure 2G:
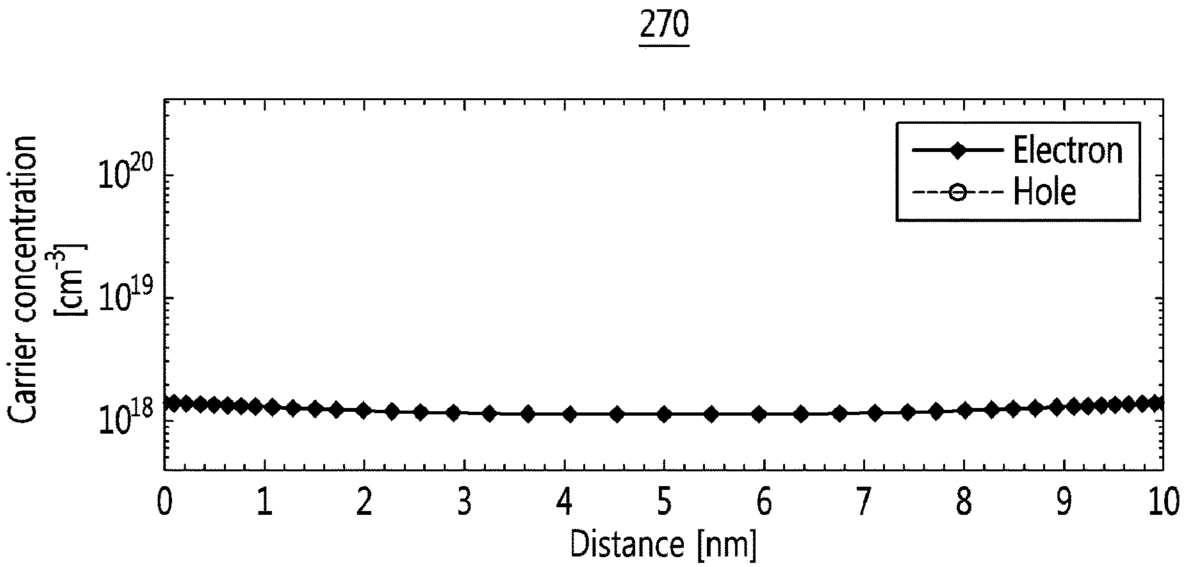
Figure 2H:
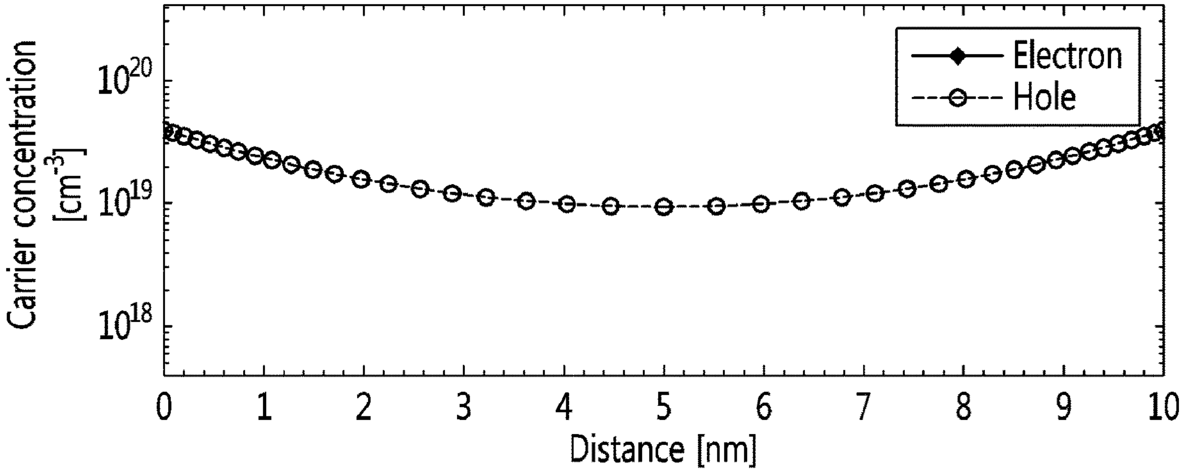
Figure 3A:
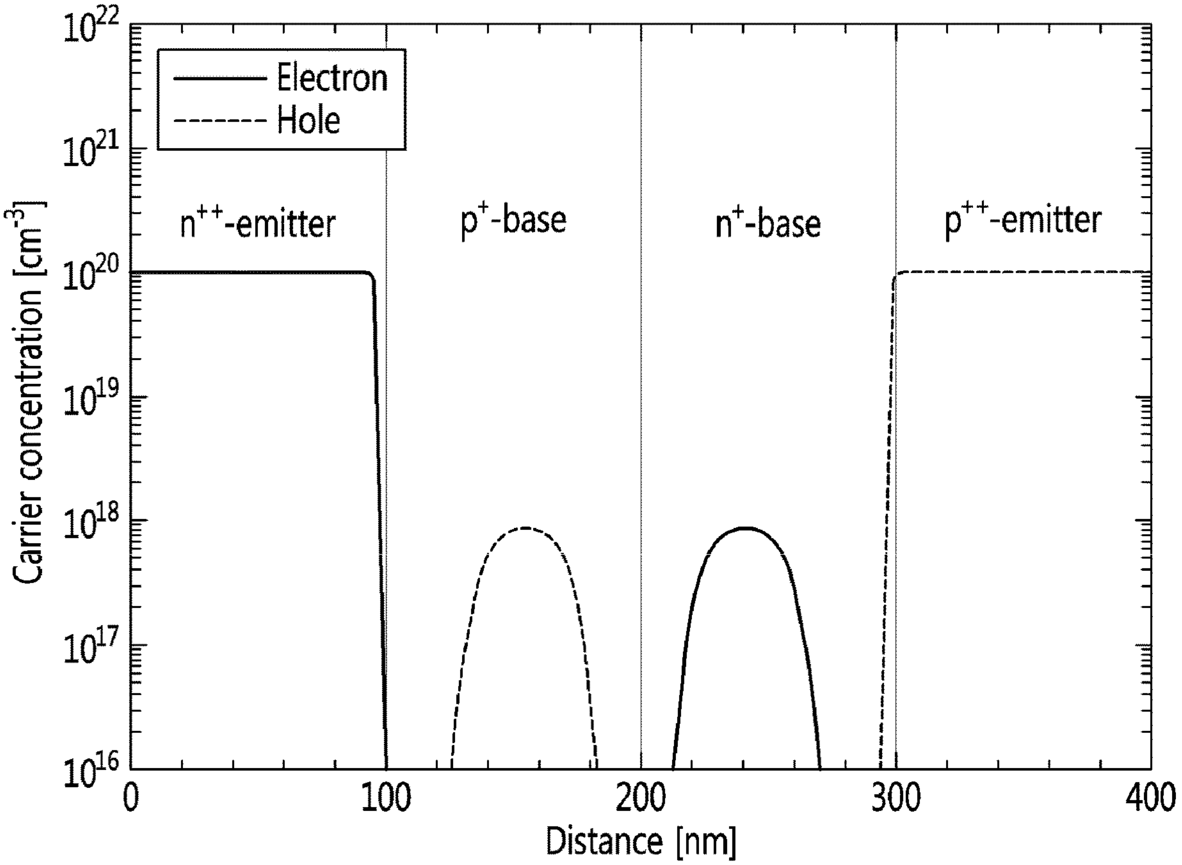
FIGS. 3A to 3D are diagrams for explaining carrier concentration characteristics and energy band structure characteristics depending on the cross-sectional length of a thyristor according to one embodiment.
Figure 3B:
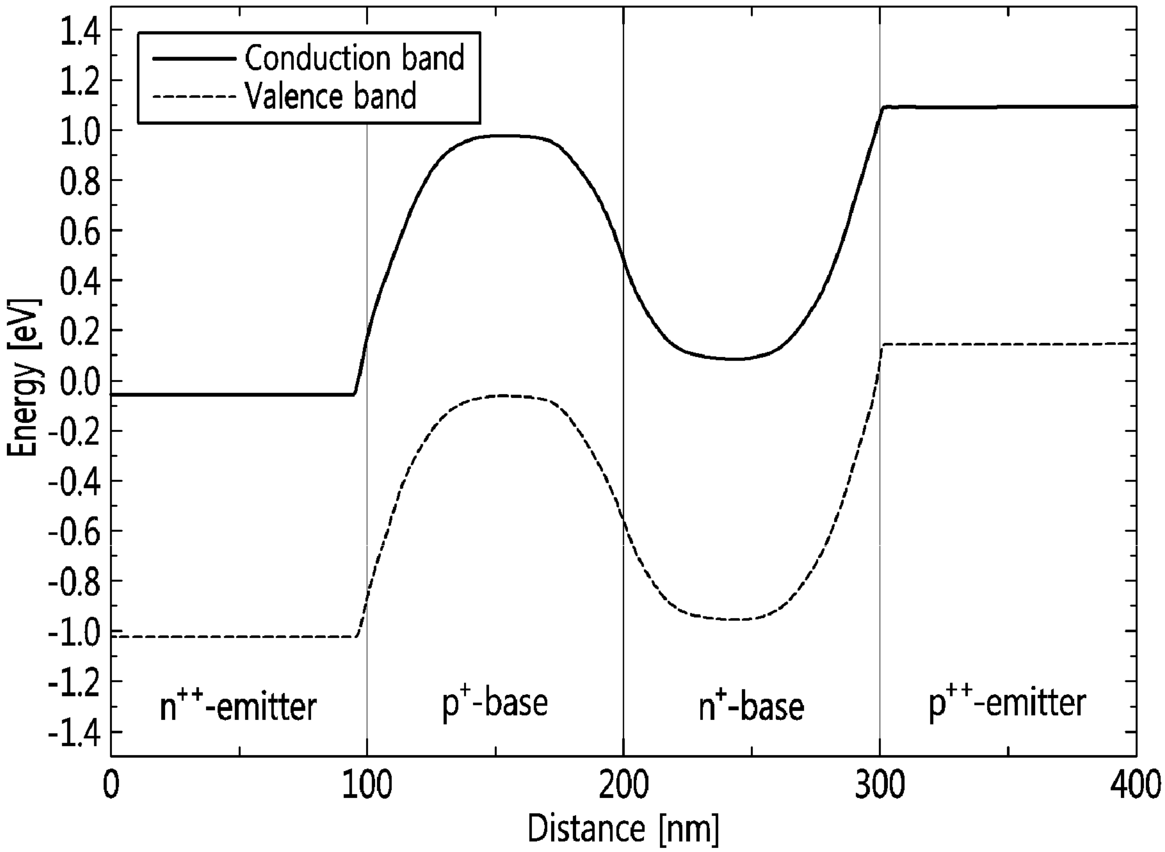
Figure 3C:
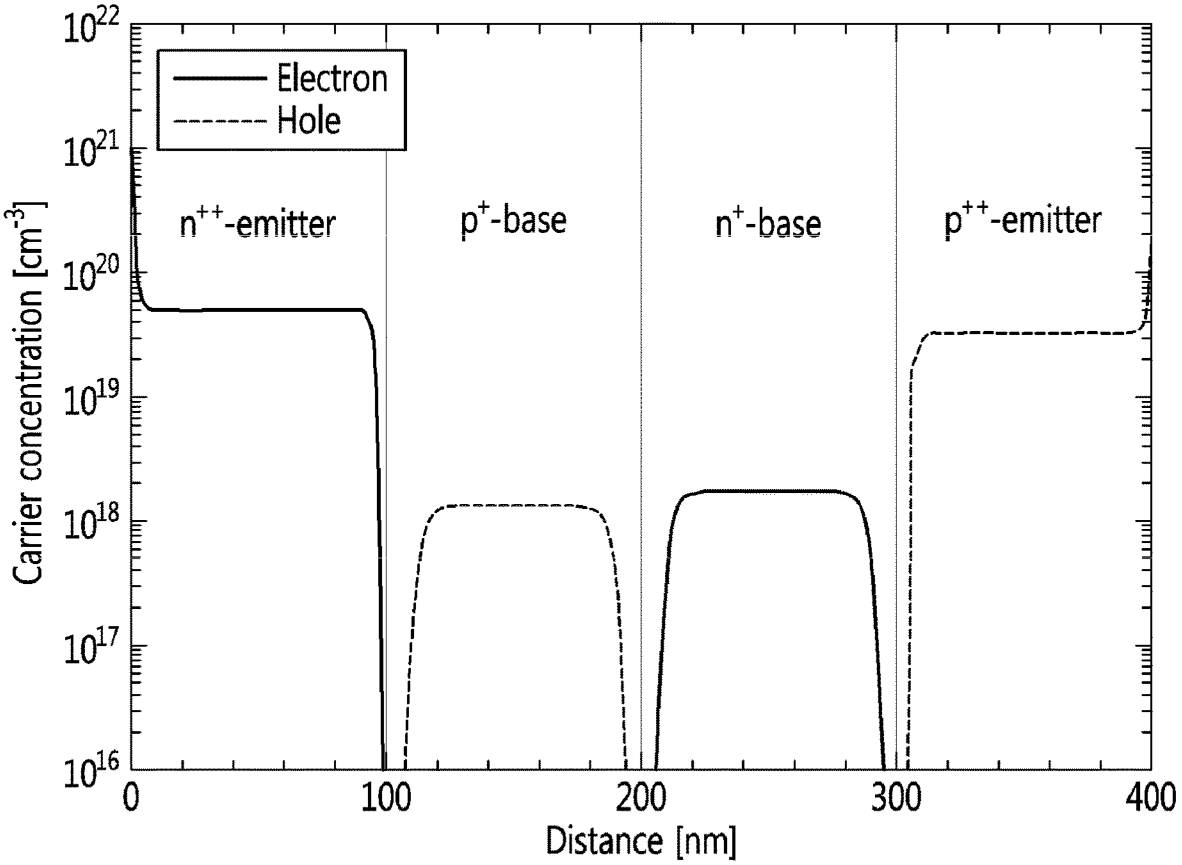
Figure 3D:
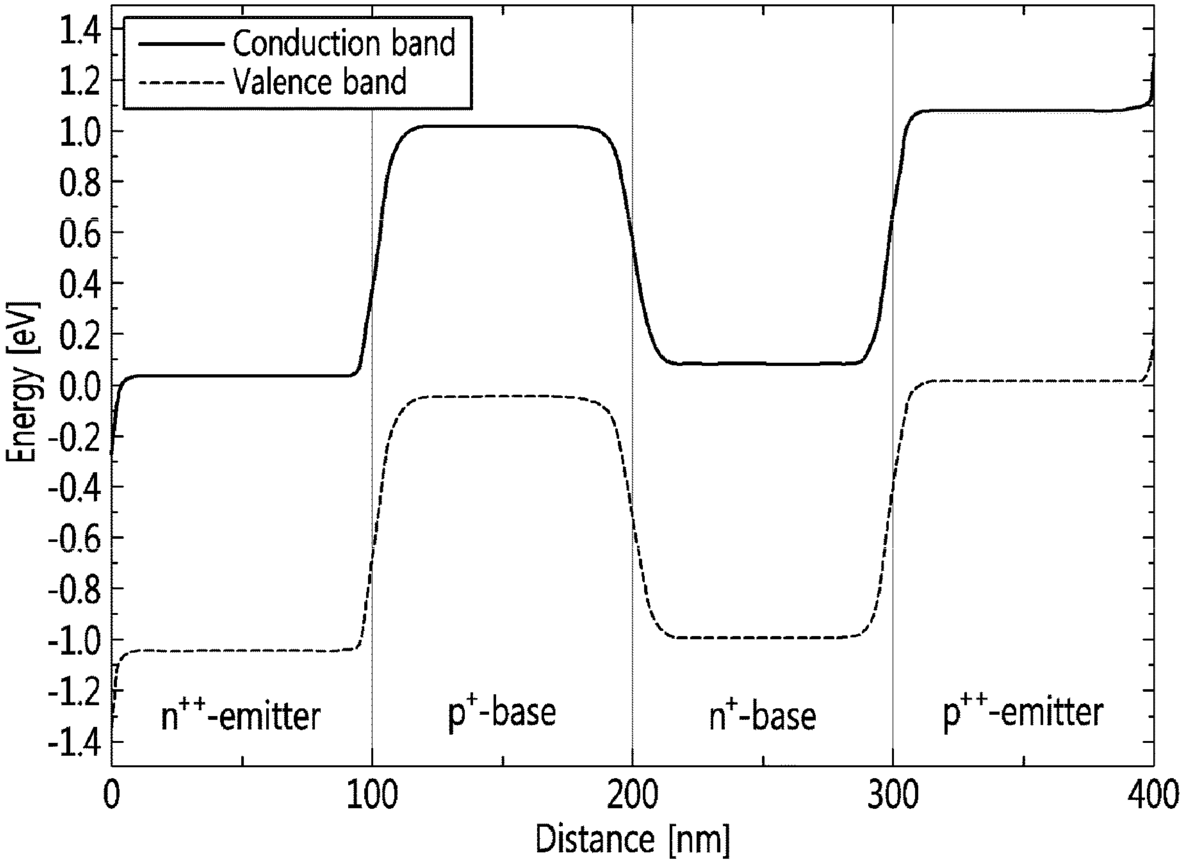

FIGS. 1A and 1B are diagrams for explaining a thyristor having a vertical structure according to one embodiment.

Referring to FIGS. 1A and 1B, FIG. 1A shows a thyristor according to one embodiment, and FIG. 1B shows the cross-sectional view of the thyristor according to one embodiment.

According to FIGS. 1A and 1B, a thyristor 100 according to one embodiment may be implemented through the charge plasma phenomenon without a doping process, and may secure excellent electrical characteristics in memory operation.

In addition, the thyristor 100 may be applied to a memory cell without a capacitor and a doping process, and may solve problems caused by dopant diffusion, misfit dislocation, RDF, low throughput, and low mobility.

Accordingly, the thyristor 100 may include a semiconductor core 110 with an insulating film 120 formed on the outer peripheral surface thereof and a plurality of metal layers M1 to M4 formed on the insulating film 120.

For example, the metal layers M1 to M4 may include the first metal layer M1, the second metal layer M2, the third metal layer M3, and the fourth metal layer M4. Each of the metal layers M1 to M4 may be formed along the outer peripheral surface of the semiconductor core 110 on which the insulating film 120 is formed. In addition, the semiconductor core 110 may be formed based on undoped Si.

In the semiconductor core 110 according to one embodiment, at least one layer of a base layer and an emitter layer may be formed on a region corresponding to each of the metal layers based on the charge plasma phenomenon due to the difference in work function with the metal layers.

Specifically, a conventional thyristor performs boron doping in the case of p-type and phosphorus or arsenic doping in the case of n-type through an in-situ doping epitaxial growth process or ion implantation process on a base layer and an emitter layer. On the other hand, the thyristor 100 according to one embodiment may implement a thyristor using charge plasma resulting from the difference in work function between a metal and a semiconductor.

Here, according to the charge plasma phenomenon, when a junction consisting of metal-insulating film (oxide)-semiconductor is formed, the difference in work function between the metal and the semiconductor causes bending of the energy band of the semiconductor, which makes the semiconductor appear as if the semiconductor is doped with n-type or p-type even though the semiconductor is not directly doped. The charge inside the semiconductor induced at this time is expressed as charge plasma.

According to one aspect of the present invention, in the semiconductor core 110, a first emitter layer may be formed on a first region A1 corresponding to the first metal layer M1, a first base layer may be formed on a second region A2 corresponding to the second metal layer M2, a second base layer may be formed on a third region A3 corresponding to the third metal layer M3, and a second emitter layer may be formed on a region corresponding to the fourth metal layer M4.

For example, in the semiconductor core 110, an edge region corresponding to the first metal layer M1 may be implemented as a cathode terminal, and an edge region corresponding to the fourth metal layer M4 may be implemented as an anode terminal. That is, the thyristor 100 according to one embodiment may be implemented as a two-terminal (anode and cathode terminals) thyristor.

According to one aspect of the present invention, in the semiconductor core 110, the first emitter layer may be formed as an n-type emitter layer, the first base layer may be formed as a p-type base layer, the second base layer may be formed as an n-type base layer, and the second emitter layer may be formed as a p-type emitter layer.

In addition, in the semiconductor core 110, the first emitter layer may be formed as a p-type emitter layer, the first base layer may be formed as an n-type base layer, the second base layer may be formed as a p-type base layer, and the second emitter layer may be formed as an n-type emitter layer.

Specifically, on the semiconductor core 110, a first emitter layer, a first base layer, a second base layer, and a second emitter layer may be formed based on the first to fourth metal layers M1 to M4 having different work functions.

In addition, on the semiconductor core 110, a first emitter layer and a second base layer may be formed based on the first and third metal layers M1 and M3 having the same work function, and a first base layer and a second emitter layer may be formed based on the second and fourth metal layers M2 and M4 having the same work function.

For example, in the semiconductor core 110, the first metal layer M1 may be formed of a metal having a work function of 3.9 eV, the second metal layer M2 may be formed of a metal having a work function of 5.2 eV, the third metal layer M3 may be formed of a metal having a work function of 4.2 eV, and the fourth metal layer M4 may be formed of a metal having a work function of 5.5 eV to implement a thyristor with a structure of an $n^{++}$-type emitter (first emitter layer), a $p^{+}$-type base (first base layer), an $n^{+}$-type base (second base layer), and a $p^{++}$-type emitter (second emitter layer).

In addition, the thyristor 100 may be applied as a memory cell of a cross-point memory.

Specifically, the thyristor 100 according to one embodiment implemented using the charge plasma phenomenon without a doping process may be applied as a memory cell of a cross-point memory. In this case, problems caused by dopant diffusion, misfit dislocation, RDF, and low throughput may be solved, and coulomb scattering due to doping may be prevented, thereby improving mobility characteristics.

In addition, conventional thyristor-based IT-DRAM has the problem of having a retention time shorter than a refresh time of 64 ms. However, a cross-point memory based on the thyristor 100 according to one embodiment may improve retention time characteristics by applying voltage to the second or third metal layer M2 or M3 of the thyristor 100 provided in each of a plurality of memory cells.

That is, the thyristor 100 may be implemented as a 3-terminal or 4-terminal (anode, cathode, and gate terminals) thyristor.

According to one aspect of the present invention, the thyristor 100 may control latch-down voltage ($V_{LD}$) and latch-up voltage ($V_{LU}$) by adjusting the work functions of the second and third metal layers M2 and M3.

Specifically, in the case of conventional thyristor-based 1T-DRAM, voltage is controlled using the characteristic that latch-down voltage ($V_{LD}$) and latch-up voltage ($V_{LU}$) increase as the doping concentration of a base increases. On the other hand, in the case of the thyristor 100 according to one embodiment, voltage may be controlled using the characteristic that latch-down voltage ($V_{LD}$) and latch-up voltage ($V_{LU}$) increase as the work function of the second metal layer M2 increases and the work function of the third metal layer M3 decreases.

The characteristics of applying the thyristor 100 according to one embodiment as a memory cell of a cross-point memory will be described in more detail later with reference to FIGS. 5A and 5B.

FIGS. 2A to 2H are diagrams for explaining carrier concentration characteristics depending on the cross-sectional width of a thyristor according to one embodiment.

Referring to FIGS. 2A to 2H, reference numbers 210 to 240 show carrier concentration characteristics depending on the cross-sectional width of conventional vertical thyristor-based 1T-DRAM based on a doping process, and reference numbers 250 to 280 show carrier concentration characteristics depending on the cross-sectional width of the vertical thyristor-based cross-point memory according to one embodiment based on the charge plasma phenomenon.

Here, the cross-sectional width refers to a distance corresponding to the direction perpendicular to the stacking direction of each layer (i.e., first to second emitter layers, first to second base layers) constituting the thyristor, that is, the distance of each layer in the cross-sectional direction (horizontal direction).

Specifically, each of reference numbers 210 to 240 shows carrier concentration characteristics depending on the cross-sectional width of each of the first emitter layer ($n^{++}$-type emitter), first base layer ($p^{+}$-type base), second base layer ($n^{+}$-type base), and second emitter layer ($p^{++}$-type emitter) of the conventional thyristor-based IT-DRAM.

In addition, reference numbers 250 to 280 show carrier concentration characteristics depending on the cross-sectional width of each of the first emitter layer ($n^{++}$-type emitter), first base layer ($p^{+}$-type base), second base layer ($n^{+}$-type base), and second emitter layer ($p^{++}$-type emitter) of the thyristor-based cross-point memory according to one embodiment.

Referring to reference numbers 210 to 280, it can be confirmed that the conventional thyristor-based IT-DRAM in which the first emitter layer ($n^{++}$-type emitter), the first base layer ($p^{+}$-type base), the second base layer ($n^{+}$-type base), and the second emitter layer ($p^{++}$-type emitter) are respectively doped at a concentration of $1\times10^{20}$ $cm^{-3}$, $1\times10^{18}$ $cm^{-3}$, $1\times10^{18}$ $cm^{-3}$, and $1\times10^{20}$ $cm^{-3}$ exhibits a carrier concentration that is almost identical to the doping concentration of each layer regardless of cross-sectional distances.

On the other hand, in the case of the thyristor-based cross-point memory according to one embodiment based on the charge plasma phenomenon, as a location approaches the edge of each layer, the concentration of the location approaches the intended concentration, and as a location approaches the center of each layer, the concentration of the location decreases.

In particular, in the thyristor-based cross-point memory according to one embodiment, the phenomenon of reducing the concentration as described above is noticeable in an emitter with a relatively high concentration. In cell sizes of 10 nm or less, the difference in concentration between the edge and the center is less than 10 times, so the phenomenon is not considered a problem in operating as a thyristor.

FIGS. 3A to 3D are diagrams for explaining carrier concentration characteristics and energy band structure characteristics depending on the cross-sectional length of a thyristor according to one embodiment.

Referring to FIGS. 3A to 3D, reference numbers 310 and 320, respectively, show carrier concentration characteristics and energy band structures depending on the cross-sectional length of the conventional thyristor-based IT-DRAM based on a doping process.

In addition, reference numbers 330 and 340, respectively, show carrier concentration characteristics and energy band structures depending on the cross-sectional length of the cross-point memory based on the thyristor according to one embodiment based on the charge plasma phenomenon.

Here, the cross-sectional length refers to a distance corresponding to the stacking direction of each layer (i.e., first and second emitter layers, first and second base layers) constituting the thyristor, that is, the distance of each layer in the longitudinal-sectional direction (vertical direction).

Referring to reference numbers 310 to 340, in the case of the conventional thyristor-based IT-DRAM, the carrier concentration cannot maintain the doping concentration due to a depletion phenomenon where the first base layer ($p^{+}$-base) and the second base layer ($n^{+}$-base) form a junction with the adjacent layer and reduces. As a result, a gentle energy band structure is shown.

On the other hand, in the case of the cross-point memory based on the thyristor according to one embodiment, since there is no dopant doping, the depletion phenomenon does not occur, so the intended concentration may be maintained at the junction. Accordingly, a steep energy band structure is shown.

That is, the cross-point memory based on the thyristor according to one embodiment and the conventional thyristor-based 1T-DRAM have different carrier concentrations and energy band structures in the longitudinal-sectional direction, but it is analyzed that this is not a problem in operating as a thyristor.

Figure 4:
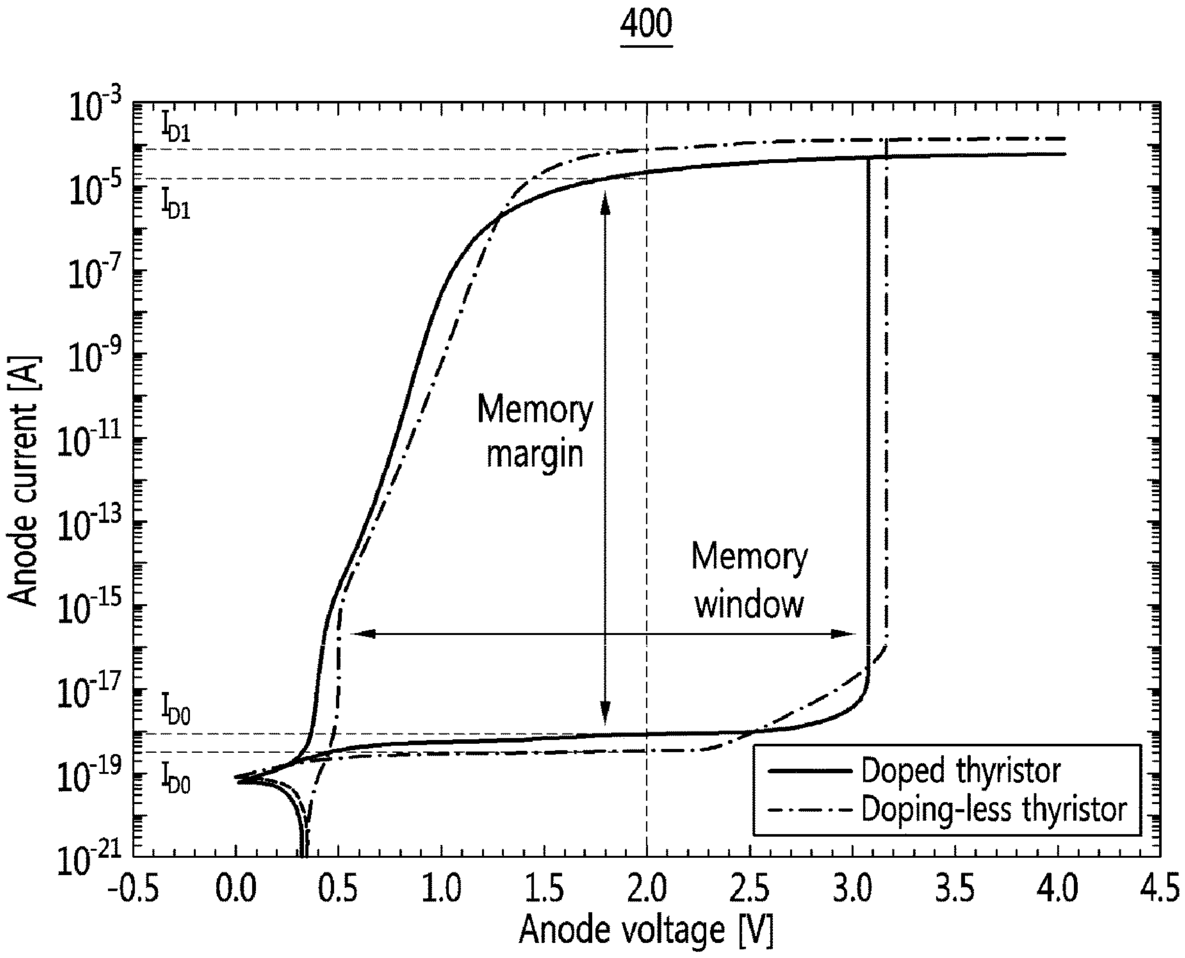
FIG. 4 is a diagram for explaining the electrical characteristics of a thyristor having a vertical structure according to one embodiment.

FIG. 4 is a diagram for explaining the electrical characteristics of a thyristor having a vertical structure according to one embodiment.

Referring to FIG. 4, reference number 400 shows the comparison results of the electrical characteristics of the conventional thyristor-based 1T-DRAM (doped thyristor) based on a doping process and the cross-point memory (doping-less thyristor) based on the thyristor according to one embodiment based on the charge plasma phenomenon.

In addition, the main parameters of the electrical characteristics of the conventional thyristor (doped thyristor)-based 1T-DRAM and the cross-point memory (doping-less thyristor) based on the thyristor according to one embodiment are shown in Table 1 below.

TABLE 1

| | Doped thyristor | Doping-less thyristor |
|---|---|---|
| Latch-up voltage ($V_{LU}$) | 3.09 V | 3.17 V |
| Latch-down voltage ($V_{LD}$) | 0.42 V | 0.51 V |
| Memory window ($V_{LU}$-$V_{LD}$) | 2.67 V | 2.66 V |
| D0 current ($I_{D0}$) @ anode voltage ($V_A$) = 2V | $8.17 \times 10^{-19}$ A | $3.39 \times 10^{-19}$ A |
| D1 current ($I_{D0}$) @ anode voltage ($V_A$) = 2V | $1.91 \times 10^{-5}$ A | $6.85 \times 10^{-5}$ A |
| Memory margin ($I_{D1}/I_{D0}$) | $2.34 \times 10^{13}$ | $2.02 \times 10^{14}$ |

According to reference number 400 and Table 1, the cross-point memory (doping-less thyristor) based on the thyristor according to one embodiment exhibits high D1 current, low D0 current, and a 0.8 V higher $V_{LD}/V_{LU}$ compared to the conventional thyristor-based 1T-DRAM (doped thyristor).

In addition, the cross-point memory (doping-less thyristor) based on the thyristor according to one embodiment exhibits a memory window at the same level as the conventional thyristor-based 1T-DRAM (doped thyristor).

As a result, the cross-point memory (doping-less thyristor) based on the thyristor according to one embodiment exhibits a memory margin approximately 10 times larger than that of the conventional thyristor-based IT-DRAM (doped thyristor).

That is, the cross-point memory (doping-less thyristor) based on the thyristor according to one embodiment is capable of thyristor operation like the conventional thyristor-based IT-DRAM (doped thyristor). In addition, the cross-point memory exhibits excellent electrical characteristics.

Figure 5A:
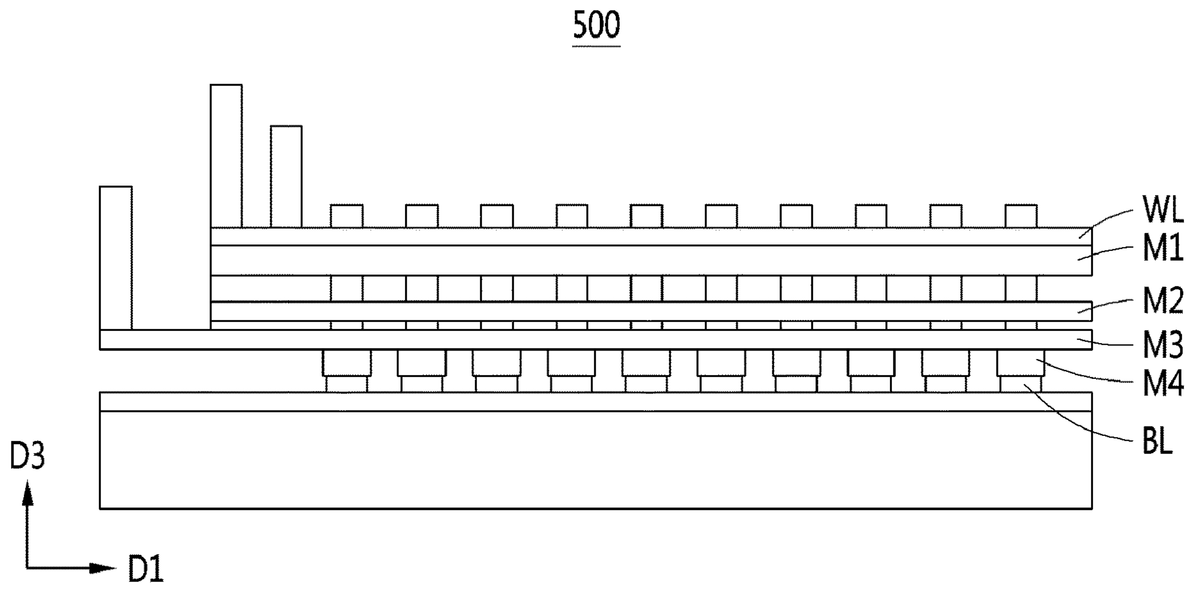
FIGS. 5A and 5B are diagrams for explaining a vertical thyristor-based cross-point memory array according to one embodiment.
Figure 5B:
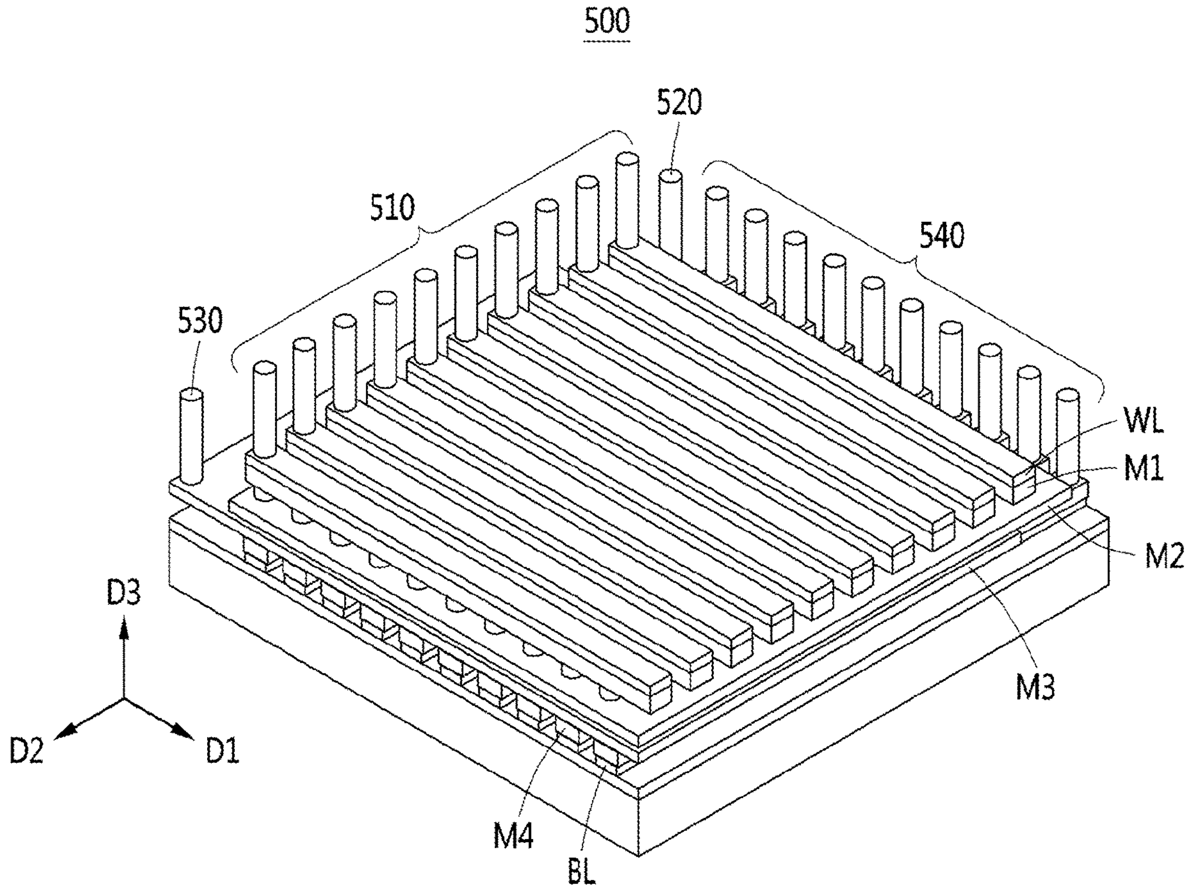

FIGS. 5A and 5B are diagrams for explaining a vertical thyristor-based cross-point memory array according to one embodiment.

Referring to FIGS. 5A and 5B, FIG. 5A shows a cross-point memory array according to one embodiment, and FIG. 5B shows the cross-sectional view of the cross-point memory array according to one embodiment.

Referring to FIGS. 5A and 5B, a cross-point memory array 500 according to one embodiment may include a plurality of word lines WL arranged parallel to a first direction D1, a plurality of bit lines BL arranged parallel to a second direction D2 that intersects the first direction D1, and a plurality of memory cells formed in regions where the word lines WL and the bit lines BL intersect.

For example, the word lines WL and the bit lines BL may include at least one metal material of gold (Au), cobalt (Co), copper (Cu), iron (Fe), nickel (Ni), palladium (Pd), platinum (Pt), and ruthenium (Ru).

Each of a plurality of memory cells according to one embodiment may include a thyristor in which at least one layer of a base layer and an emitter layer is formed based on the charge plasma phenomenon due to a difference in the work function of a semiconductor core and a plurality of metal layers.

That is, the thyristor included in each of the memory cells in FIGS. 5A and 5B is the thyristor according to one embodiment described with reference to FIGS. 1A to 4. Hereinafter, among content explained with reference to FIGS. 5A and 5B, content that overlaps with the content explained with reference to FIGS. 1A to 4 will be omitted.

Specifically, the cross-point memory array 500 according to one embodiment may be a memory device (i.e., capacitor-less memory) that uses the thyristor according to one embodiment as a memory cell without a capacitor.

According to one aspect of the present invention, an insulating film may be formed on the outer peripheral surface of the semiconductor core, and metal layers M1 to M4 may be formed on the insulating film. In addition, the metal layers M1 to M4 may include the first metal layer M1, the second metal layer M2, the third metal layer M3, and the fourth metal layer M4.

For example, in the memory cells, the first metal layers M1 of memory cells located on the same word line WL may be connected to each other, and the fourth metal layers M4 of memory cells located at the same bit line BL may be connected to each other.

According to one aspect of the present invention, the memory cells may share a single second metal layer and a single third metal layer.

Specifically, the cross-point memory array 500 may include one second metal layer M2 and one third metal layer M3 implemented in a plate shape, and each of a plurality of thyristors corresponding to the memory cells may share the second metal layer M2 and the third metal layer M3.

According to one aspect of the present invention, in the semiconductor core, a first emitter layer may be formed in the first region corresponding to the first metal layer M1 among a plurality of metal layers, a first base layer may be formed in the second region corresponding to the second metal layer M2 among the metal layers, a second base layer may be formed in the third region corresponding to the third metal layer M3 among the metal layers, and a second emitter layer may be formed in the region corresponding to the fourth metal layer M4 among the metal layers.

Specifically, in the semiconductor core, the first emitter layer may be formed as an n-type emitter layer, the first base layer may be formed as a p-type base layer, the second base layer may be formed as an n-type base layer, and the second emitter layer may be formed as a p-type emitter layer.

In addition, in the semiconductor core, the first emitter layer may be formed as a p-type emitter layer, the first base layer may be formed as an n-type base layer, the second base layer may be formed as a p-type base layer, and the second emitter layer may be formed as an n-type emitter layer.

In addition, the cross-point memory array 500 may further include a plurality of first emitter contact vias 510, a plurality of second emitter contact vias 540, a first base contact via 520, and a second base contact via 530.

Specifically, the first emitter contact vias 510 may be formed in the same number as the word lines WL, and the second emitter contact vias 540 may be formed in the same number as the bit lines BL.

In addition, each of the first emitter contact vias 510 may be disposed at a position corresponding to each of the word lines WL, so that the corresponding word lines WL and the first metal layers M1 of the memory cells connected to the corresponding word lines WL are connected. Each of the second emitter contact vias 540 may be disposed at a position corresponding to each of the bit lines BL, so that the corresponding bit lines BL and the fourth metal layers M4 of the memory cells connected to the corresponding to the bit lines BL are connected.

In addition, the first base contact via 520 may be connected to the second metal layer M2 shared by the memory cells, and the second base contact via 530 may be connected to the third metal layer M3 shared by the memory cells.

In conclusion, when the present invention is used, by implementing the thyristor through the charge plasma phenomenon without a doping process, excellent electrical characteristics in memory operation may be secured.

In addition, when the present invention is used, by applying the thyristor to a memory cell without a capacitor and a doping process, problems caused by dopant diffusion, misfit dislocation, RDF, low throughput, and low mobility may be solved.

In addition, when the present invention is used, the thyristor suitable for mass production may be provided.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A thyristor having a vertical structure, comprising:

a semiconductor core with an insulating film formed on an outer peripheral surface thereof; and a plurality of metal layers formed on the insulating film, wherein the semiconductor core includes:

a first emitter layer formed in a first region corresponding to a first metal layer among the plurality of metal layers based on a charge plasma phenomenon due to a difference in work function with the plurality of metal layers;

a first base layer formed in a second region corresponding to a second metal layer among the plurality of metal layers based on the charge plasma phenomenon due to the difference in work function with the plurality of metal layers;

a second base layer formed in a third region corresponding to a third metal layer among the plurality of metal layers based on the charge plasma phenomenon due to the difference in work function with the plurality of metal layers; and a second emitter layer formed in a region corresponding to a fourth metal layer among the plurality of metal layers based on the charge plasma phenomenon due to the difference in work function with the plurality of metal layers, and wherein the second metal layer is formed of a metal having a work function greater than a work function of the third metal layer, thereby increasing a latch-down voltage and a latch-up voltage.

2. The thyristor according to claim 1, wherein, the semiconductor core, the first emitter layer is formed as an n-type emitter layer, the first base layer is formed as a p-type base layer, the second base layer is formed as an n-type base layer, and the second emitter layer is formed as a p-type emitter layer.

3. The thyristor according to claim 1, wherein, in the semiconductor core, the first emitter layer is formed as a p-type emitter layer, the first base layer is formed as an n-type base layer, the second base layer is formed as a p-type base layer, and the second emitter layer is formed as an n-type emitter layer.

4. The thyristor according to claim 1, wherein, in the semiconductor core, the first emitter layer, the first base layer, the second base layer, and the second emitter layer are formed based on the first and fourth metal layers having different work functions.

5. The thyristor according to claim 1, wherein, in the semiconductor core, the first emitter layer and the second base layer are formed based on the first and third metal layers having identical work functions, and the first base layer and the second emitter layer are formed based on the second and fourth metal layers having identical work functions.

6. A thyristor-based cross-point memory array, comprising:

a plurality of word lines arranged parallel to a first direction;

a plurality of bit lines arranged parallel to a second direction intersecting the first direction; and a plurality of memory cells formed in regions where the word lines and the bit lines intersect, wherein each of the memory cells comprises a thyristor having a vertical structure, the thyristor comprising a semiconductor core with an insulating film formed on an outer peripheral surface thereof, and a plurality of metal layers formed on the insulating film, wherein the semiconductor core includes:

a first emitter layer formed in a first region corresponding to a first metal layer among the plurality of metal layers based on a charge plasma phenomenon due to a difference in work function with the plurality of metal layers;

a first base layer formed in a second region corresponding to a second metal layer among the plurality of metal layers based on the charge plasma phenomenon due to the difference in work function with the plurality of metal layers;

a second base layer formed in a third region corresponding to a third metal layer among the plurality of metal layers based on the charge plasma phenomenon due to the difference in work function with the plurality of metal layers; and a second emitter layer formed in a region corresponding to a fourth metal layer among the plurality of metal layers based on the charge plasma phenomenon due to the difference in work function with the plurality of metal layers, and wherein the second metal layer is formed of a metal having a work function greater than a work function of the third metal layer, thereby increasing a latch-down voltage and a latch-up voltage.

7. The thyristor-based cross-point memory array according to claim 6, wherein an insulating film is formed on an outer peripheral surface of the semiconductor core, and the plurality of metal layers are formed on the insulating film.

8. The thyristor-based cross-point memory array according to claim 6, wherein the memory cells share the second metal layer and the third metal layer.

* * * * *